United States Patent
Sohn et al.

(10) Patent No.: US 7,332,855 B2
(45) Date of Patent: Feb. 19, 2008

(54) PHOSPHOR BLENDS FOR WAVELENGTH CONVERSION AND WHITE LIGHT EMITTING DEVICE USING THE SAME

(75) Inventors: Jong Rak Sohn, Suwon (KR); Chul Soo Yoon, Suwon (KR); Joon Ho Yoon, Seoul (KR)

(73) Assignee: Samsung Electro-Mechanics Co., Ltd., Kyungki-Do (KR)

(*) Notice: Subject to any disclaimer, the term of this patent is extended or adjusted under 35 U.S.C. 154(b) by 519 days.

(21) Appl. No.: 11/060,287

(22) Filed: Feb. 18, 2005

(65) Prior Publication Data

US 2006/0061252 A1   Mar. 23, 2006

(30) Foreign Application Priority Data

Sep. 23, 2004   (KR) .................... 10-2004-0076300

(51) Int. Cl.
*H01J 1/62* (2006.01)
*H01J 63/04* (2006.01)

(52) U.S. Cl. ............ 313/487; 252/301.5; 252/301.4 H; 252/301.4 P; 252/301.4 F

(58) Field of Classification Search ................ 313/487, 313/512; 252/301.4 F, 301.4 R, 301.5
See application file for complete search history.

(56) References Cited

U.S. PATENT DOCUMENTS

| 5,957,560 A * | 9/1999 | Do et al. .................... 353/88 |
| 6,621,211 B1 * | 9/2003 | Srivastava et al. .......... 313/503 |
| 6,723,455 B2 * | 4/2004 | Ueda et al. ................. 428/690 |
| 2005/0013943 A1 * | 1/2005 | Wakefield .................. 428/1.21 |
| 2005/0093816 A1 * | 5/2005 | Kang et al. ................. 345/102 |

* cited by examiner

*Primary Examiner*—Akm Ullah
*Assistant Examiner*—Trent Schindler
(74) *Attorney, Agent, or Firm*—Lowe Hauptman Ham & Berner

(57) ABSTRACT

The present invention provides a phosphor blend for wavelength conversion and a white light emitting device using the phosphor blend. Further disclosed is a white light emitting phosphor blend comprising 0.5~18 wt % of $A_5(PO_4)_3Cl:Eu^{2+}$ (where A is at least one element selected from Sr, Ca, Ba and Mg), 0.7~14 wt of $D_2SiO_4$:Eu (where D is at least one element selected from Ba, Sr and Ca), and 68~98.5 wt % of $G_5Eu_S(WO_4)_{2.5+1.5S}$:Sm (where G is at least one element selected from Li, Na and K; and s is a number between 1 and 5), based on the total weight of the phosphor blend.

10 Claims, 3 Drawing Sheets

PHOSPHOR BLENDS FOR WAVELENGTH CONVERSION AND WHITE LIGHT EMITTING DEVICE USING THE SAME

RELATED APPLICATIONS

The present application is based on, and claims priority from, Korean Application No. 2004-76300, filed on Sep. 23, 2004, the disclosure of which is incorporated by reference herein in its entirety.

BACKGROUND OF THE INVENTION

1. Field of the Invention

The present invention relates to phosphor blends for wavelength conversion. More specifically, the present invention relates to a phosphor blend for wavelength conversion capable of producing various colors, a phosphor blend emitting white light with reduced yellowing and a high color rendering index, and a white light emitting device using the white light emitting phosphor blend.

2. Description of the Related Art

Generally, phosphors for wavelength conversion are materials used for converting light at particular wavelengths emitted from various light sources to light at desired wavelengths. Among various light sources, light emitting diodes are particularly advantageous for backlights in liquid crystal displays (LCDs), automotive illuminators, and household illuminators in terms of their low driving power and superior light emission efficiency. For these reasons, phosphor materials have recently been spotlighted as key materials for manufacturing white LEDs.

Conventional white light emitting devices are predominantly manufactured by applying a yellow phosphor to a blue LED. More specifically, $YAG(Y_3Al_5Gd_{12})$:Ce as a yellow phosphor is applied to the light-emitting surface of a blue LED, including a GaN/InGaN active layer, to convert a portion of blue light to yellow light, and then the converted yellow light is combined with the unconverted portion of the blue light to produce white light.

However, as the operation temperature increases after long-term use, the problem of yellowing becomes more serious.

Further, conventional white light emitting devices composed of a YAG:Ce phosphor and a blue LED have the disadvantage of poor color rendering properties. That is, as can be seen from the graph shown in FIG. 1, the wavelengths of white light emitted by the yellow phosphor are distributed in the blue and yellow wavelength ranges only. Accordingly, the conventional white light emitting devices show poor color rendering properties and thus there is a limitation in the production of the desired natural white light.

On the other hand, conventional phosphor materials for wavelength conversion provide colors of light emitted from particular light sources and colors of output light at particular wavelengths, and thus their color distributions are very limited. Consequently, there is a limitation in the application of conventional phosphor materials to colors of light emitted from various light sources and/or various colors of output light in order to meet the needs of users.

Thus, there exists a need in the art for a phosphor blend emitting white light with a high color rendering index and reduced yellowing, and a white light emitting device using the phosphor blend. Further, there is a need for a phosphor blend capable of ensuring a broad range of color distribution.

SUMMARY OF THE INVENTION

Therefore, the present invention has been made in view of the above problems of the prior art, and it is a first object of the present invention to provide a phosphor blend for wavelength conversion in which phosphor materials are combined so as to enable the production of various colors.

It is a second object of the present invention to provide a novel white light emitting phosphor blend in which blue, yellow and red phosphor materials are blended so as to emit white light having reduced yellowing and a high color rendering index when applied to a near-UV LED.

It is a third object of the present invention to provide a white light emitting device having superior characteristics in which the white light emitting phosphor blend is applied to a near-UV LED.

In accordance with a first aspect of the present invention, the above objects can be accomplished by a phosphor blend for wavelength conversion whose CIE color coordinates are located inside a triangular area on a CIE chromaticity coordinate system whose angular points (0.15, 0.03), (0.19, 0.63) and (0.67, 0.33), and which comprises three phosphor materials represented by the formulae $A_5(PO_4)_3Cl:Eu^{2+}$ (where A is at least one element selected from Sr, Ca, Ba and Mg), $D_2SiO_4$:Eu (where D is at least one element selected from Ba, Sr and Ca) and $G_5Eu_S(WO_4)_{2.5+1.5S}$:Sm (where G is at least one element selected from Li, Na and K; and s is a number between 1 and 5).

In accordance with a second aspect of the present invention, there is provided a white light emitting phosphor blend which comprises 0.5~18 wt % of $A_5(PO_4)_3Cl:Eu^{2+}$ (where A is at least one element selected from Sr, Ca, Ba and Mg), 0.7~14 wt of $D_2SiO_4$:Eu (where D is at least one element selected from Ba, Sr and Ca), and 68~98.5 wt % of $G_5Eu_S(WO_4)_{2.5+1.5S}$:Sm (where G is at least one element selected from Li, Na and K; and s is a number between 1 and 5), based on the total weight of the phosphor blend.

Preferably, the white light emitting phosphor blend comprises 1~9 wt % of $A_5(PO_4)_3Cl:Eu^{2+}$, 1.5~7 wt % of $D_2SiO_4$:Eu, and 84~98.5 wt % of $G_5Eu_S(WO_4)_{2.5+1.5S}$:Sm.

The white light emitting phosphor blend of the present invention preferably emits output light having a high color rendering index (75 or more) against incident near-UV light. For increased color rendering index of the output light, the white light emitting phosphor blend comprises 4.5~7 wt % of $A_5(PO_4)_3Cl:Eu^{2+}$, 2~3 wt % of $D_2SiO_4$:Eu, and 89~94.5 wt % of $G_5Eu_S(WO_4)_{2.5+1.5S}$: Sm.

In accordance with a third aspect of the present invention, there is provided a white light emitting device using the white light emitting phosphor blend. The white light emitting device comprises a near-UV light emitting diode and a wavelength conversion section formed in the direction of light emitted from the light emitting diode, the wavelength conversion section including a white light emitting phosphor blend consisting of 0.5~18 wt % of $A_5(PO_4)_3Cl:Eu^{2+}$ (where A is at least one element selected from Sr, Ca, Ba and Mg), 0.7~14 wt % of $D_2SiO_4$:Eu (where D is at least one element selected from Ba, Sr and Ca) and 68~98.5% of $G_5Eu_S(WO_4)_{2.5+1.5S}$:Sm (where G is at least one element selected from Li, Na and K; and s is a number between 1 and 5), based on the total weight of the phosphor blend.

The wavelength conversion section can be formed by molding a mixture of the white light emitting phosphor blend and a silicone or epoxy resin. Preferably, the light output from the light emitting device, i.e. white light converted by the wavelength conversion section, has a color rendering index of at least 75.

Thus, a main feature of the present invention is a phosphor blend for wavelength conversion in which red, green and blue phosphors are blended so as to enable the distributions of almost all colors.

Another feature of the present invention of the present invention is a white light emitting phosphor blend in which red, green and blue phosphors are blended in an appropriate ratio so as to emit white light having reduced yellowing and better color rendering properties.

Still another feature of the present invention of the present invention is a white light emitting device using the white light emitting phosphor blend, which is capable of outputting light close to natural white light.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

The present invention will now be described in more detail with reference to the accompanying drawings.

A phosphor blend for wavelength conversion according to the present invention is prepared by combining appropriate red, green and blue phosphors so as to enable the production of various colors. The blue phosphor employed in the phosphor blend of the present invention is $A_5(PO_4)_3Cl:Eu^{2+}$ (where A is at least one element selected from Sr, Ca, Ba and Mg). The green phosphor is $D_2SiO_4:Eu$ (where D is at least one element selected from Ba, Sr and Ca). The red phosphor is $G_5Eu_S(WO_4)_{2.5+1.5S}:Sm$ (where G is at least one element selected from Li, Na and K, and s is a number between 1 and 5). An appropriate combination of the three phosphors, i.e., red, green and blue phosphors, leads to various changes in the color of the phosphor blend.

Figure 3:
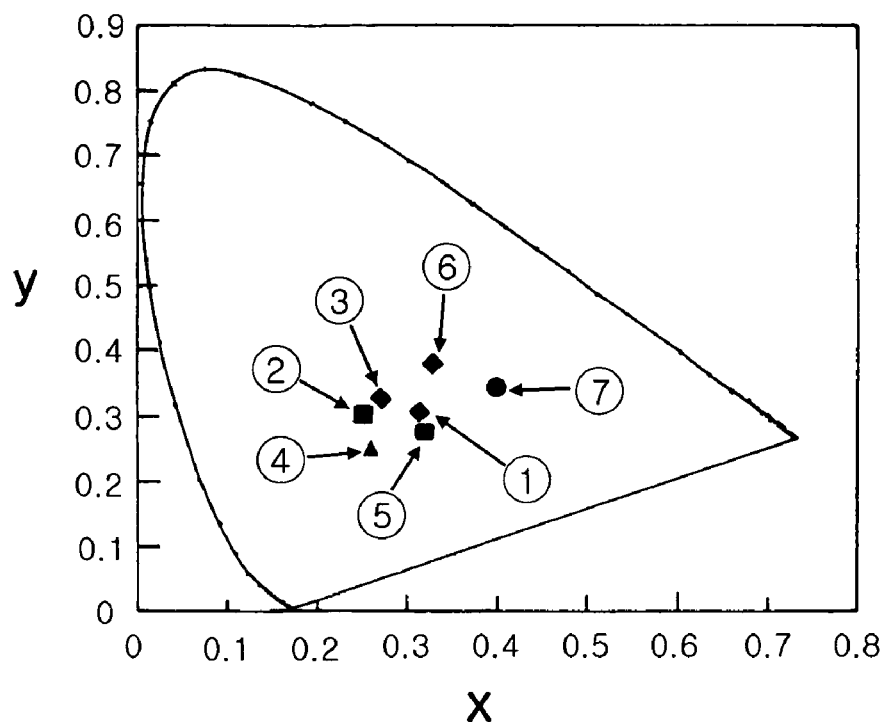
FIG. 3 is a chromaticity coordinate system showing the color range of a phosphor blend for wavelength conversion according to one aspect of the present invention.

The color range achievable by the phosphor blend of the present invention can be defined as being located inside a triangular area on a CIE chromaticity coordinate system whose angular points (0.15, 0.03), (0.19, 0.63) and (0.67, 0.33), as demonstrated in an experiment conducted in Example 1 below (see FIG. 3). This color range is difficult to achieve by conventional monochromatic phosphors or combinations of two phosphor materials. In conclusion, the phosphor blend for wavelength conversion according to the present invention is advantageous in that various colors can be easily created through an appropriate blending ratio between the phosphor materials.

Further, the phosphor blend for wavelength conversion according to the present invention can be provided as a white light emitting phosphor blend which can output white light with superior characteristics against incident near-UV light (from about 350 nm to about 450 nm) at a particular blending ratio. The white light emitting phosphor blend of the present invention can be prepared by combining 0.5~18 wt % of $A_5(PO_4)_3Cl:Eu^{2+}$ (where A is at least one element selected from Sr, Ca, Ba and Mg), 0.7~14 wt % of $D_2SiO_4:Eu$ (where D is at least one element selected from Ba, Sr and Ca), and 68~98.5 wt % of $G_5Eu_S(WO_4)_{2.5+1.5S}:Sm$ (where G is at least one element selected from Li, Na and K, and s is a number between 1 and 5), based on the total weight of the phosphor blend.

The white light emitting phosphor blend of the present invention can be responded to near-UV light, unlike a YAG-based phosphor-blue LED combination. In addition, there is an advantage in that the white light emitting phosphor blend can minimize discoloration problems, e.g., yellowing, with the lapse of operation time, unlike conventional phosphors.

The blending ratio is one decided considering a relatively large difference (±100%) in the efficiency of the phosphors depending on the preparation processes or content ranges, and errors resulting from the properties of a package. Preferred content ranges of each of the phosphors are 1~9 wt % of $A_5(PO_4)_3Cl:Eu^{2+}$ as the blue phosphor, 1.5~7 wt % of $D_2SiO_4:Eu$ as the green phosphor, and 84~98.5 wt % of $G_5Eu_S(WO_4)_{2.5+1.5S}:Sm$ as the red phosphor.

The white light emitting phosphor blend of the present invention can produce a white color that is close to the natural color having a high color rendering index. Conventional phosphor materials are difficult to attain a color rendering index of 70 or more. In contrast, the white light emitting phosphor blend of the present invention can attain a color rendering index of 75 or more, preferably about 80, and thus emits white light close to natural color. A preferred blending ratio between $A_5(PO_4)_3Cl:Eu^{2+}$, $D_2SiO_4:Eu_4$ and $G_5Eu_S(WO_4)_{2.5+1.5S}:Sm$ that can attain white light having a high color rendering index is 5~7 wt %: 2~3 wt %: 89~94.5 wt %. However, since a high color rendering index (~75) even in blending ratios different from the preferred ratio can be attained depending on various factors, including efficiency of the phosphors used and structure of a package, the present invention is not limited to the preferred ratio.

Figure 2:
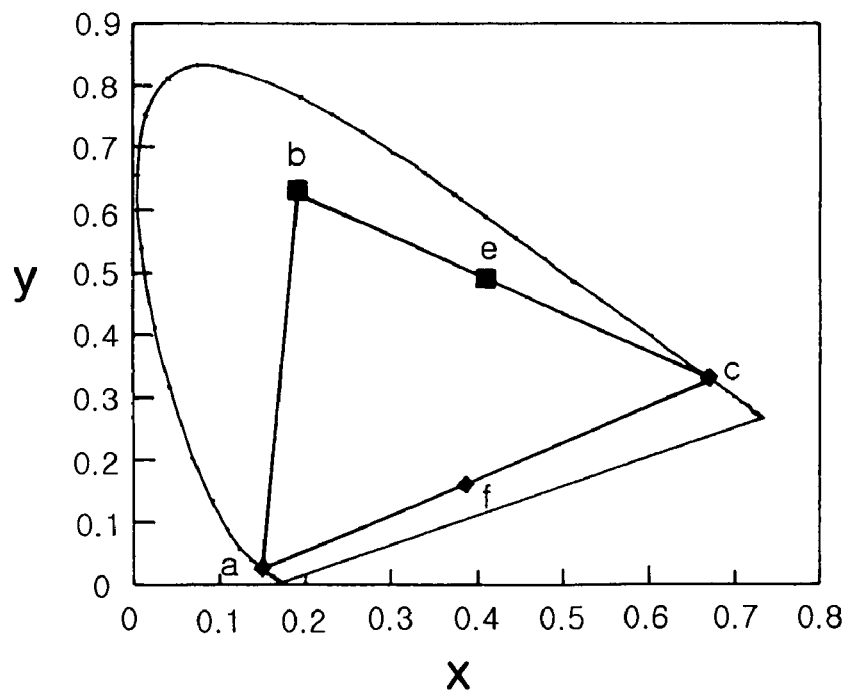
FIG. 2 is a graph showing the wavelengths of white light converted from near-UV light by a white light emitting phosphor blend according to another aspect of the present invention.

The white light emitting phosphor blend of the present invention can be combined with a near-UV LED to manufacture a white light emitting device for a high-quality illuminator. Such a white light emitting device can be modified into various structures. Referring to FIGS. 2a and 2b, there are shown white light emitting devices according to the present invention.

The white light emitting device 20 shown in FIG. 2a includes an exterior molding portion 28 and two lead frames 22a and 22b. The lead frame 22a has a cup formed at one end, and a near-UV LED 25 is mounted on the cup. Two electrodes (not shown) of the UV-light LED 25 are connected to the lead frames 22a and 22b through two wires 26a and 26b, respectively. A wavelength conversion section 29 containing the white light emitting phosphor blend is provided on the cup. The wavelength conversion section 29 can be easily formed by appropriately mixing the white light emitting phosphor blend with an epoxy or silicone resin, and molding the mixture.

The white light emitting device 30 shown in FIG. 2b includes a substrate 31, and two lead frames 32a and 32b formed on the substrate 31. A near-UV light emitting diode 35 is arranged on the substrate, and two electrodes (not shown) of the UV-light LED 25 are connected to the lead frames 32a and 32b through two wires 36a and 36b, respectively. A wavelength conversion section 39 is formed in such a manner that the white light emitting phosphor blend surrounds the light emitting diode 35. The wavelength conversion section 39 is prepared by appropriately mixing the white light emitting phosphor blend with an epoxy or silicone resin. The formation of the wavelength conversion section 39 can be carried out by molding, e.g., transfer molding, as is apparent to those skilled in the art.

Since the wavelength conversion sections 29 and 39 shown in FIGS. 2a and 2b can convert near-UV light emitted from the respective LEDs 25 and 36 to white light having reduced yellowing and superior color rendering properties by the action of the white light emitting phosphor blend.

The operation and effects of the present invention will be explained in more detail with reference to the following specific examples.

EXAMPLE 1

In this example, the range of color coordinates of phosphor blends for wavelength conversion according to the present invention was determined.

First, $(Sr,Ca)_5(PO_4)_3Cl:Eu^{2+}$, $(Ba,Sr)_2SiO_4:Eu$ and $K_5Eu_S(WO_4)_{2.5+1.5S}:Sm$ (where s is 2.5) were prepared as blue, green and red phosphors, respectively. Thereafter, to determine the color range achievable by the combinations of the phosphors, the phosphors were mixed in accordance with the blending ratios indicated in Table 1 to prepare five samples (Samples a, b, c, d and e).

The chromaticity of each of the samples was measured, coordinates corresponding to a CIE chromaticity coordinate system were obtained, and the obtained coordinates were marked on the CIE chromaticity coordinate system. The color coordinates of the samples are shown in Table 2, and are mapped out on the CIE chromaticity coordinate system, as shown in FIG. 3.

TABLE 2

|  | x | y |
|---|---|---|
| Sample a | 0.15 | 0.03 |
| Sample b | 0.19 | 0.63 |
| Sample c | 0.67 | 0.33 |
| Sample d | 0.17 | 0.31 |
| Sample e | 0.41 | 0.49 |
| Sample f | 0.38 | 0.15 |

Referring to FIGS. 2a and 2b, together with Table 2, the color ranges of the phosphor blends for wavelength conversion prepared in this example can be defined as being located inside a triangular area on a CIE chromaticity coordinate system whose angular points (0.15, 0.03), (0.19, 0.63) and (0.67, 0.33). Thus, it could be confirmed that the phosphor blend for wavelength conversion according to the present invention can ensure a broad range of color distribution, which is impossible to achieve by conventional phosphor materials, by appropriately controlling the blending ratio.

EXAMPLE 2

This example was carried out to determine the chromaticity and the white light emitting properties (yellowing and color rendering index) of white light emitting phosphor blends according to the present invention.

First, in the same manner as Example 1, $(Sr,Ca)_5(PO_4)_3Cl:Eu^{2+}$, $(Ba,Sr)_2SiO_4:Eu$ and $K_5Eu_S(WO_4)_{2.5+1.5S}:Sm$ (where s is 2.5) were prepared as blue, green and red phosphors, respectively. Thereafter, to examine the color range achievable by the combinations of the phosphors, the phosphors were mixed in accordance with the blending ratios indicated in Table 3 to prepare seven samples (Samples 1 to 7).

TABLE 1

|  | $(Sr, Ca)_5(PO_4)_3Cl:Eu^{2+}$ (wt %) | $(Ba, Sr)_2SiO_4:Eu$ (wt %) | $K_5Eu_S(WO_4)_{2.5+1.5S}:Sm$ (wt %) |
|---|---|---|---|
| Sample a | 100 | 0 | 0 |
| Sample b | 0 | 100 | 0 |
| Sample c | 0 | 0 | 100 |
| Sample d | 56 | 44 | 0 |
| Sample e | 0 | 3.53 | 96.47 |
| Sample f | 4.38 | 0 | 95.62 |

TABLE 3

|  | $(Sr, Ca)_5(PO_4)_3Cl:Eu^{2+}$ (wt %) | $(Ba, Sr)_2SiO_4:Eu$ (wt %) | $K_5Eu_S(WO_4)_{2.5+1.5S}:Sm$ (wt %) |
|---|---|---|---|
| Sample 1* | 5.37 | 2.56 | 92.07 |
| Sample 2 | 7.89 | 6.31 | 85.80 |
| Sample 3 | 4.14 | 6.57 | 89.30 |
| Sample 4 | 8.14 | 3.26 | 88.60 |
| Sample 5 | 4.30 | 1.72 | 93.98 |
| Sample 6 | 2.18 | 3.38 | 92.39 |
| Sample 7 | 1.02 | 1.62 | 97.36 |

The phosphor blends having the compositions indicated in Table 3 and the same near-UV LEDs (about 385 nm) were used to manufacture seven white light emitting devices having the structure shown in FIG. 2b.

Next, the chromaticity of light converted from each of the white light emitting devices was examined. Further, the light emitting devices were allowed to emit light for 5 hours by applying the same voltage to the devices, and then whether yellowing occurred or not was examined depending on changes in the chromaticity. The obtained results are shown in Table 4 below. The color coordinates are mapped out in FIG. 4.

TABLE 4

|  | x | y | Yellowing occurring |
|---|---|---|---|
| Sample 1 | 0.31 | 0.30 | No |
| Sample 2 | 0.25 | 0.30 | No |
| Sample 3 | 0.27 | 0.34 | No |
| Sample 4 | 0.26 | 0.24 | No |
| Sample 5 | 0.31 | 0.27 | No |
| Sample 6 | 0.32 | 0.38 | No |
| Sample 7 | 0.39 | 0.34 | No |

As can be seen from Table 4, all the phosphor blends of the seven samples emit white light, and little or no yellowing and few or no changes in chromaticity were observed, unlike conventional YAG-based yellow phosphors.

Based on the blending ratios of the samples adopted in this example, proper blending ratios of the white light emitting phosphor blends can be defined. In this case, external variables have to be taken into account, for example efficiency of common phosphor materials, wavelength ranges of near-UV light, compositions of phosphor materials, and structure of a package. In view of the foregoing, preferred content ranges of phosphors in a white light emitting phosphor blend having superior characteristics can be defined as being 0.5~18 wt % of $A_5(PO_4)_3Cl:Eu^{2+}$ as a blue phosphor, 0.7~14 wt % of $D_2SiO_4:Eu$ as a green phosphor, and 68~98.5% of $G_5Eu_S(WO_4)_{2.5+1.5S}:Sm$ as a red phosphor. More preferred content ranges are 1~9 wt % of a blue phosphor, 1.5~7 wt % of a green phosphor, and 84~98.5 wt % of a red phosphor.

Figure 5A:
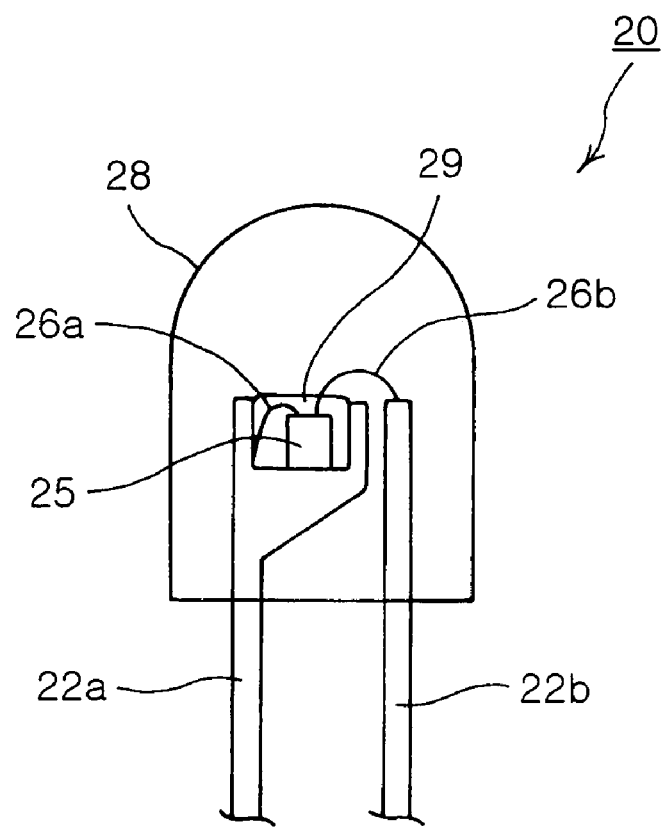
FIGS. 5a and 5b are side cross-sectional views of white light emitting devices according to aspects of the present invention.
Figure 5B:
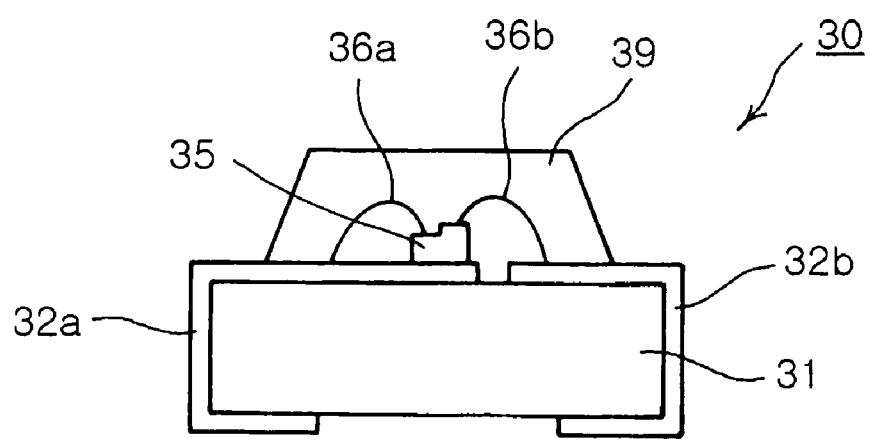

Based on the mixture characteristics of the three RGB phosphors, the seven samples prepared in this example showed a relative high color rendering index, and some of the samples had a color rendering index of 75 or more. Particularly, Sample 1 was confirmed to emit light substantially identical to the natural white color. FIG. 5 shows the wavelength characteristics of a white light emitting device to which Sample 1 was applied.

Figure 1:
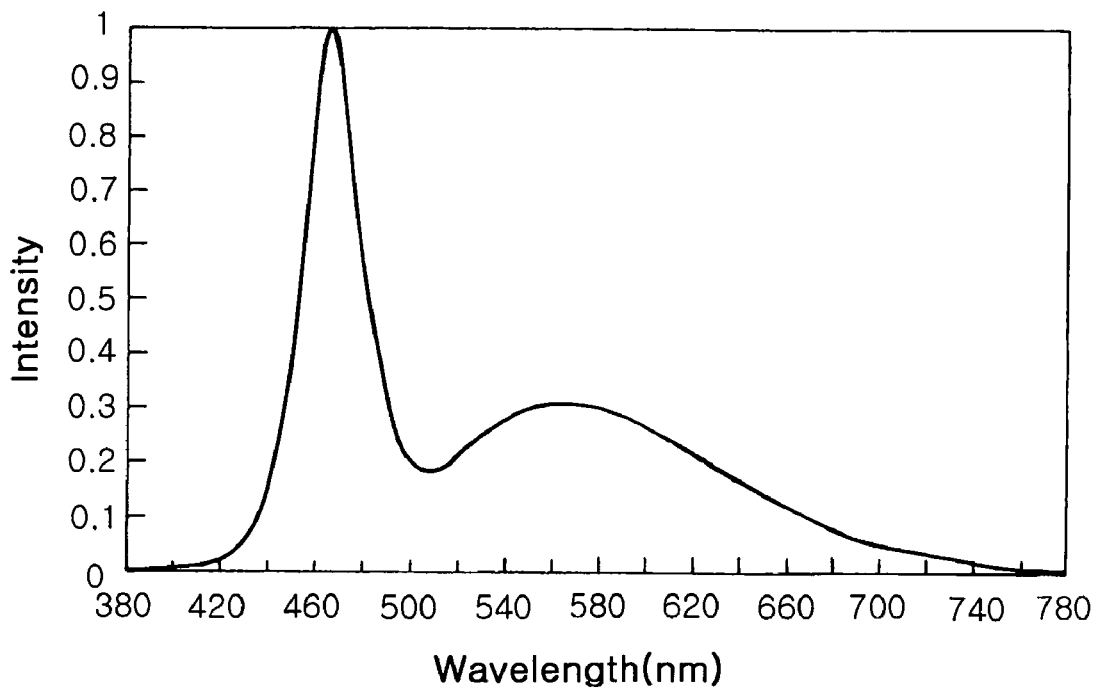
FIG. 1 is a graph showing the wavelengths of light emitted from a white light emitting device comprising a conventional YAG:Ce phosphor and a blue light emitting diode.
Figure 4:
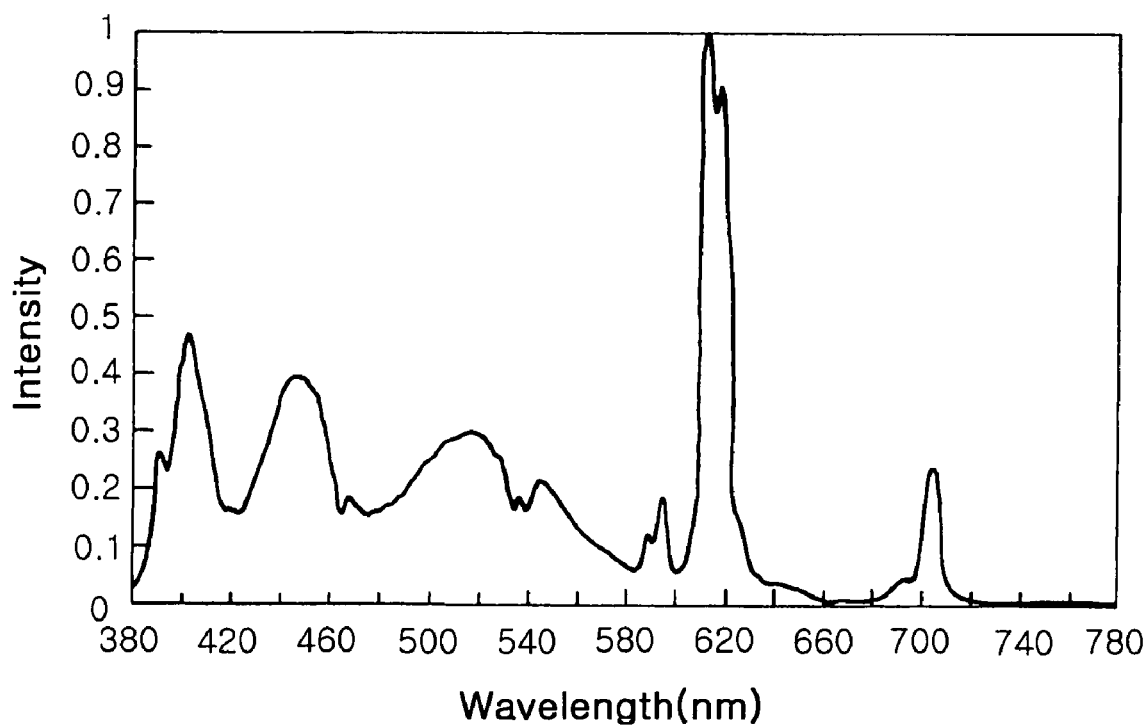
FIG. 4 is a chromaticity coordinate system showing the color range of a white light emitting phosphor blend for wavelength conversion according to another aspect of the present invention.

The results from FIG. 4 demonstrate that the light emitted from the phosphor blend of Sample 1 was broadly distributed in the visible wavelength range, compared to FIG. 1, and had a color rendering index as high as about 80. Based on the results from FIG. 4 (Sample 1), a preferred blending ratio at which white light having a high color rendering index can be emitted is 4.5~7 wt % of $A_5(PO_4)_3Cl:Eu^{2+}$, 2~3 wt % of $D_2SiO_4:Eu$, and 89~94.5 wt % of $G_5Eu_S(WO_4)_{2.5+1.5S}:Sm$.

It should be understood that the scope of the present invention is not limited by the foregoing embodiments and the accompanying drawings, but is defined by the claims that follow. Accordingly, those skilled in the art will appreciate that various substitutions, modifications and changes are possible, without departing from the technical spirit of the present invention as disclosed in the, accompanying claims, and such substitutions, modifications and changes are within the scope of the present invention.

As apparent from the above description, the present invention provides a phosphor blend for wavelength conversion that can provide a wide range of colors by blending specific red, green and yellow phosphors. In addition, the white light emitting phosphor blend in which the phosphors are blended in an appropriate ratio can minimize discoloration problems, e.g., yellowing, and can provide white light having a high color rendering index. Furthermore, the present invention can provide a light emitting device capable of outputting high-quality white light by combining the white light emitting phosphor blend with a near-UV LED.

What is claimed is:

1. A phosphor blend whose CIE color coordinates are located inside a triangular area on a CIE chromaticity coordinate system whose angular points (0.15, 0.03), (0.19, 0.63) and (0.67, 0.33), and which comprises three phosphor materials represented by the formulae $A_5(PO_4)_3Cl:Eu^{2+}$ (where A is at least one element selected from Sr, Ca, Ba and Mg), $D_2SiO_4:Eu$ (where D is at least one element selected from Ba, Sr and Ca) and $G_5Eu_S(WO_4)_{2.5+1.5S}:Sm$ (where G is at least one element selected from Li, Na and K; and s is a number between 1 and 5).

2. A white light emitting phosphor blend comprising 0.5~18 wt % of $A_5(PO_4)_3Cl:Eu^{2+}$ (where A is at least one element selected from Sr, Ca, Ba and Mg), 0.7~14 wt of $D_2SiO_4:Eu$ (where D is at least one element selected from Ba, Sr and Ca), and 68~98.5 wt % of $G_5Eu_S(WO_4)_{2.5+1.5S}:Sm$ (where G is at least one element selected from Li, Na and K; and s is a number between 1 and 5), based on the total weight of the phosphor blend.

3. The white light emitting phosphor blend according to claim 2, wherein the phosphores $A_5(PO_4)_3Cl:Eu^{2+}$, $D_2SiO_4:Eu$, and $G_5Eu_S(WO_4)_{2.5+1.5S}:Sm$ are present in amounts of 1~9 wt %, 1.5~7 wt %, and 84~98.5 wt %, respectively.

4. The white light emitting phosphor blend according to claim 2, wherein the phosphor blend emits output light having a high color rendering index of 75 or more against incident near-UV light.

5. The white light emitting phosphor blend according to claim 4, wherein the phosphores $A_5(PO_4)_3Cl:Eu^{2+}$, $D_2SiO_4$:Eu, and $G_5Eu_S(WO_4)_{2.5+1.5S}$:Sm are present in amounts of 4.5~7 wt %, 2~3 wt %, and 89~94.5 wt %, respectively.

6. A white light emitting device comprising:
a near-UV light emitting diode; and
a wavelength conversion section formed in a direction of light emitted from the light emitting diode, the wavelength conversion section including a white light emitting phosphor blend consisting of 0.5~18 wt % of $A_5(PO_4)_3Cl$: $Eu^{2+}$ (where A is at least one element selected from Sr, Ca, Ba and Mg), 0.7~14 wt % of $D_2SiO_4$:Eu (where D is at least one element selected from Ba, Sr and Ca) and 68~98.5% of $G_5Eu_S(WO_4)_{2.5+1.5S}$:Sm (where G is at least one element selected from Li, Na and K; and s is a number between 1 and 5), based on the total weight of the phosphor blend.

7. The white light emitting device according to claim 6, wherein the wavelength conversion section further includes a silicone or epoxy resin.

8. The white light emitting device according to claim 6, wherein the phosphores $A_5(PO_4)_3Cl:Eu^{2+}$, $D_2SiO_4$:Eu, and $G_5Eu_S(WO_4)_{2.5+1.5S}$:Sm are present in amounts of 1~9 wt %, 1.5~7 wt %, and 84~98.5 wt %, respectively.

9. The white light emitting device according to claim 6, wherein the phosphor blend emits output light having a high color rendering index of 75 or more against incident near-UV light.

10. The white light emitting device according to claim 9, wherein the phosphores $A_5(PO_4)_3Cl:Eu^{2+}$, $D_2SiO_4$:Eu, and $G_5Eu_S(WO_4)_{2.5+1.5S}$:Sm are present in amounts of 4.5~7 wt %, 2~3 wt %, and 89~94.5 wt %, respectively.

\* \* \* \* \*